United States Patent [19]

Marston et al.

[11] 4,435,446
[45] Mar. 6, 1984

[54] EDGE SEAL WITH POLYSILICON IN LOCOS PROCESS

[75] Inventors: Alan D. Marston, Los Altos; Lenin Anne, Cupertino, both of Calif.

[73] Assignee: Hewlett-Packard Company, Palo Alto, Calif.

[21] Appl. No.: 441,593

[22] Filed: Nov. 15, 1982

[51] Int. Cl.³ ............................................. H01L 21/76
[52] U.S. Cl. ...................................... 427/93; 156/643; 156/657; 156/662; 427/94
[58] Field of Search ................... 427/93, 94; 156/643, 156/657, 662

[56] References Cited

U.S. PATENT DOCUMENTS 4,292,156  9/1981  Matsumoto et al. ................ 204/192

OTHER PUBLICATIONS

R. D. Isaac, "Fabrication Process for Full Box Isolation Without a Bird's Beak", IBM Tech. Disclosure Bulletin, vol. 22, No. 11 (Apr. 1980), pp. 5148–5151.

*Primary Examiner*—John D. Smith
*Attorney, Agent, or Firm*—Jeffery B. Fromm

[57] ABSTRACT

Intrinsic polysilicon is used to seal the sidewalls of the active areas formed in a silicon substrate in an integrated circuit with no additional masking required over a standard local oxidation (LOCOS) process. Since polysilicon and silicon are compatible materials, a "bird's beak" free structure is produced with a minimum number of defects during subsequent processing.

5 Claims, 11 Drawing Figures

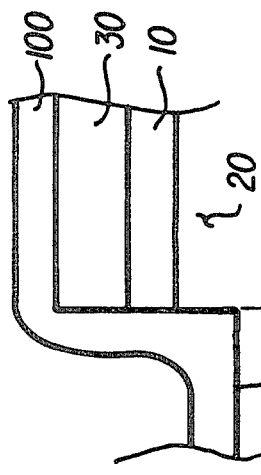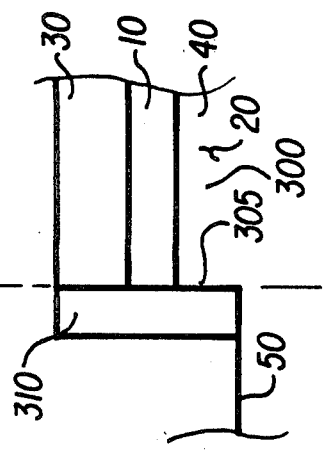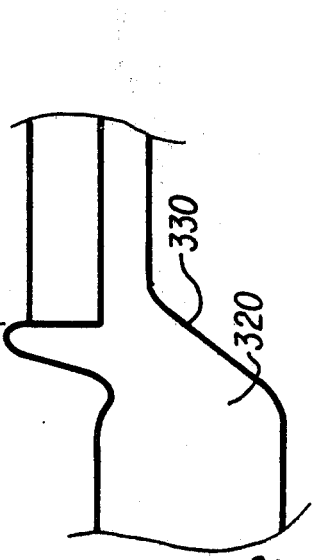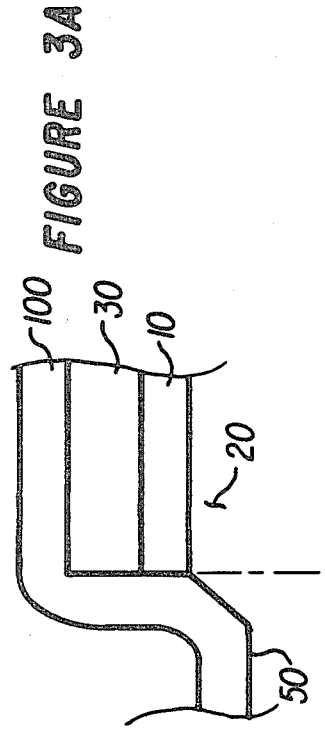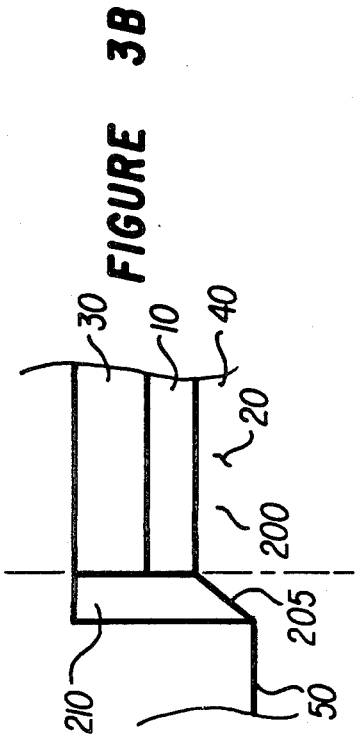
FIGURE 3A FIGURE 3B FIGURE 3C
FIGURE 4A FIGURE 4B FIGURE 4C

EDGE SEAL WITH POLYSILICON IN LOCOS PROCESS

BACKGROUND

Electrical insulating layers are typically required in both discrete semiconductor devices and in integrated circuits. This invention is concerned with a process for producing a local insulating layer by the oxidation of a semiconductor material.

The local oxidation of silicon (LOCOS) has been widely used for large scale integrated (LSI) circuits because it presents several advantages such as improvement in packing density and compatibility with standard LSI processing. However, the conventional LOCOS process used to produce a silicon dioxide insulating layer results in the formation of a so-called "bird's beak" shaped structure on the borders of the silicon dioxide. This phenomena reduces the active width of the channels which are located between areas where the oxidation of silicon has occurred. This reduction in channel width is a major obstacle to the manufacturing of very large scale integrated (VLSI) circuits when devices are scaled down to the micrometer and submicrometer range. Thus, the fabrication of the bird's beak free device has been an essential objective for many future process and scaled device technologies.

Several prior art methods are known which achieve the growing of thick oxide with small or even zero bird's beak structures, as shown in Isaac, "Fabrication Process for full Box Isolation Without a Bird's Beak" *IBM Technical Disclosure Bulletin,* Vol. 22, No. 11 (Apr. 1980) pp. 5148-51, and Matsumoto, et al., "Method of Manufacturing Semiconductor Devices," U.S. Pat. No. 4,292,156 (Sept. 29, 1981).

In these methods a standard IC process is used to form islands of silicon in a silicon substrate by means of a first masking layer of silicon nitride. Then a second layer of silicon nitride is applied to seal the edges of the islands so that when the subsequent field oxidation step is performed, no oxide is produced immediately adjacent to the island, thus preventing the creation of a "bird's beak" due to lifting of the island edges. Unfortunately, silicon nitride and silicon are incompatible so it is necessary to add stress relief silicon dioxide (SRO) layers under each silicon nitride to prevent unwanted defect generation as illustrated by Isaac. However, each such added layer requires an added process step which increase both process complexity and cost.

FIGS. 1A and 1B illustrate the prior art fabrication process with the undesirable "bird's beak". The process shown is for a non-planar active silicon surface, but a similar problem exists in a planar process as well. A stress relief layer 10 of silicon dioxide (SRO) is first thermally grown on the silicon substrate 20. Then a masking layer 30 of silicon nitride is deposited on top of the SRO layer 10. The nitride layer 30 is then patterned to define the active areas 40 and the SRO layer 10 can be etched away in the field area 50 which was exposed during the nitride patterning. For a non-planar structure the surface of the active area 40 and the surface of the exposed field area 50 are in the same plane as shown in FIG. 1A. On the other hand if a final coplanar structure is desired, the field area 50 is further recessed by either a KOH chemical etch or a plasma etch process. In either case, the field area 50 is then oxidized 60 with the resulting structure as shown in FIG. 1B. The field oxidation 60 causes the nitride layer 30 to lift at the edges forming a "bird's beak" 70. The width of the active area 40 is thus reduced by a width DW on each of two sides. This narrowing of 2*DW can result in the active area 40 becoming completely inactive or unsuitable for fabrication of devices such as transistors, interconnects, and contacts as devices are decreased in size toward 1 micrometer dimensions.

SUMMARY OF THE INVENTION

The present invention demonstrates a new isolation technique which permits the growth of thick field oxide (FOX) layer with zero bird's beak structure while at the same time minimizing the required number of process steps over the prior art while not introducing process or structure induced defects. The final structures can be either planar or non-planar integrated circuits down to and below 1 micrometer dimensions and is applicable to both N-channel and P-channel MOS transistors.

In accordance with the preferred embodiment of the present invention, a method and structure is provided for oxidizing a semiconductor surface without producing a bird's beak structure. After the active silicon areas have been defined located under stress relief silicon dioxide (SRO) and silicon nitride layers, a layer of intrinsic polysilicon is deposited over the entire wafer surface. The polysilicon layer is then anisotropically etched leaving a layer of polysilicon perpendicular to the wafer surface around the edges of the SRO and silicon nitride, and also around the vertical sidewalls of the silicon islands themselves in a coplanar process. This layer of polysilicon serves as an edge seal for the SRO layer during subsequent field oxidation preventing oxidation from taking place under the silicon nitride which causes the creation of the undesirable bird's beak. The polysilicon is oxidized during the field oxidation step and results in protection of the SRO-silicon interface.

Central to this invention is the use of polysilicon to seal the SRO from oxidation and the complete compatibility of polysilicon with the fabrication of ICs without inducing defects during subsequent processing. A further significant feature is that no additional masking is required over the standard LOCOS process with the additional costs and defects that can result from such added processing steps.

DESCRIPTION OF THE DRAWINGS

FIGS. 3A, 3B and 3C show a second embodiment of the present invention.

FIGS. 4A, 4B and 4C show a third embodiment of the present invention.

DESCRIPTION OF THE PREFERRED EMBODIMENTS

Figure 2A:
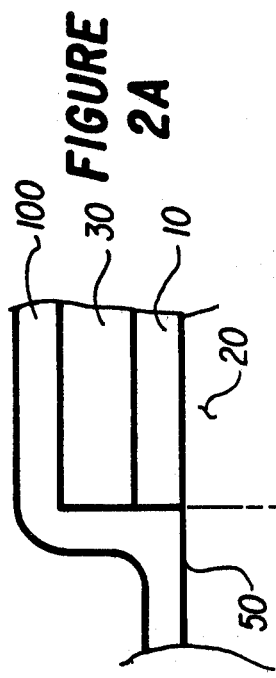
FIGS. 2A, 2B and 2C show a first embodiment of the present invention.
Figure 2B:
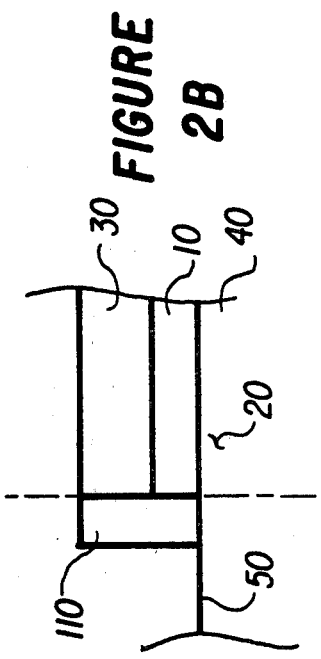
Figure 2C:
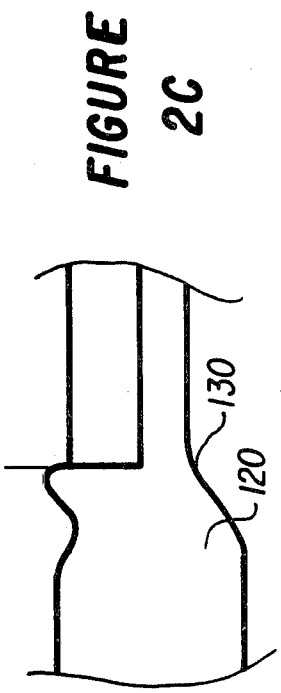
Figure 1A:
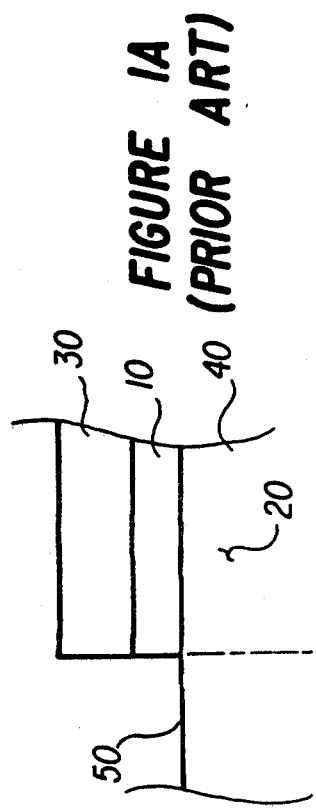
FIGS. 1A and 1B show a prior art fabrication process with the undesirable "bird's beak".
Figure 1B:
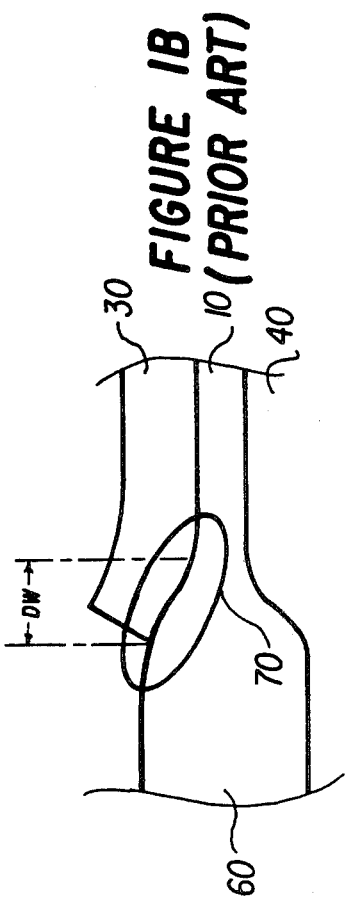

FIGS. 2A, 2B and 2C show the preferred embodiment of the present invention as applied to a non-planar integrated circuit (IC) structure. As in the prior art (FIG. 1A) a SRO layer 10 and a nitride layer 30 are applied to define an active area 40 and a field region 50 in the substrate 20. A layer of intrinsic polysilicon 100 is then deposited over the complete wafer by means of low pressure chemical vapor deposition (LPCVD) as shown in FIG. 2A. The polysilicon layer 100 is anisotropically etched, for example, by plasma etching. This leaves an area of polysilicon 110 around the edges of the SRO layer 10 and nitride layer 30 as shown in FIG. 2B. The polysilicon area 110 and field region 50 are then oxidized as shown in FIG. 2C forming a protective field oxide layer 120 protecting the SRO-silicon interface region 130. The polysilicon layer 110 thus serves as an edge seal for the SRO layer 10 during field oxidation preventing oxidation from taking place under the nitride layer 30, inhibiting the lifting of the nitride layer 30 which causes the undesirable "bird's beak". The IC fabrication then proceeds in a standard manner.

The thickness of the polysilicon layer 100 should be nominally 1500 angstroms when, for example, a field oxidation layer 120 of 6000 angstroms is used in the process. The thickness ratio of polysilicon 100 to field oxide 120 should be kept in the range of 1:6 to 1:2. If a thinner polysilicon layer 100 is used the "bird's beak" will no longer be eliminated. If a thicker polysilicon layer is used, beyond a ratio of 1:2, the oxide will not penetrate to the substrate 20.

A secondary benefit of the use of polysilicon as an edge seal is that the thickness ratio of the nitride layer 30 and the SRO layer 10 is no longer critical as in the prior art. Classically the nitride to SRO thickness ratio has been kept between 3:1 or 4:1 to prevent bending stress caused by the mechanical mismatch of silicon nitride and silicon dioxide. For example, a 1500 angstroms nitride layer is used when 500 angstroms SRO layer is used. Because of the close physical characteristics between polysilicon and silicon, the nitride to SRO thickness ratio becomes less critical, which permits greater flexibility in the IC fabrication.

FIGS. 3A, 3B, 3C, 4A, 4B and 4C show the application of the present invention as applied to coplanar IC structures. In FIG. 3A after the SRO layer 10 and nitride layer 30 are applied to define an active area 40 in the substrate 20, a silicon mesa 200 is created with sloping side 205 by chemically etching the field region 50 with for example KOH. As shown in FIG. 4A, a silicon mesa 300 can be created with nearly vertical sides 305 by the use of a plasma etch. The polysilicon layer 100 is then applied as in FIG. 1A and the process proceeds as before.

In either coplanar process the polysilicon edge seal 210 and 310 will not only seal the edges of the SRO layer 10 and nitride layer 30, but also the silicon sidewalls 205 and 305 of the mesas 200 and 300 respectively.

Thus, the SRO-silicon interface regions 230 and 330 are protected during the formation of the field oxide 220 and 230 and the "bird's beak" is inhibited as in the nonplanar structure discussed previously.

We claim:
1. In a method for producing a semiconductor structure, the steps comprising:
forming a covering layer over a semiconductor substrate;
removing portions of the covering layer to expose desired areas on the substrate;
depositing a layer of polysilicon over the entire preceding structure;
anisotropically etching the polysilicon layer to remove the polysilicon in the plane parallel to the semiconductor substrate; and
oxidizing the remaining polysilicon and the exposed areas of the semiconductor substrate forming a field oxide layer whereby a bird's beak free structure is produced.

2. A method as in claim 1 wherein the field oxide layer is between two and six times the thickness of the deposited polysilicon layer.

3. In a method for producing a semiconductor structure, the steps comprising:
forming a first oxide layer over a semiconductor substrate;
depositing a second layer over the first oxide layer;
forming a desired pattern in the second layer;
removing the first oxide layer no longer overlain with second layer to expose areas of the semiconductor substrate;
depositing a layer of polysilicon over the entire preceding structure;
anisotropically etching the polysilicon layer to remove the polysilicon in the plane parallel to the semiconductor substrate; and
oxidizing the remaining polysilicon layer and the exposed areas of the semiconductor substrate forming a field oxide layer whereby a bird's beak free structure is produced.

4. A method as in claim 3 wherein the field oxide layer is between two and six times the thickness of the deposited polysilicon layer.

5. A method as in claim 3 wherein the second layer is silicon nitride.

* * * * *

UNITED STATES PATENT AND TRADEMARK OFFICE
CERTIFICATE OF CORRECTION

PATENT NO. : 4,435,446

DATED : March 6, 1984

INVENTOR(S) : Alan D. Marston, Lenin Anne

It is certified that error appears in the above—identified patent and that said Letters Patent is hereby corrected as shown below:

Column 1, Line 46, after "nitride" insert -- layer --.

Column 3, Line 29, after "when" insert -- a --.

Signed and Sealed this

Twenty-fifth Day of December 1984

[SEAL]

Attest:

*Attesting Officer*

GERALD J. MOSSINGHOFF

*Commissioner of Patents and Trademarks*